United States Patent
Cho et al.

(10) Patent No.: US 6,333,886 B2
(45) Date of Patent: Dec. 25, 2001

(54) SELF-REFRESH CONTROLLING APPARATUS

(75) Inventors: Kwang-Rae Cho; Joon-Ho Kim, both of Ichon-shi (KR)

(73) Assignee: Hyundai Electronics Industries Co., Ltd. (KR)

( * ) Notice: Subject to any disclaimer, the term of this patent is extended or adjusted under 35 U.S.C. 154(b) by 0 days.

(21) Appl. No.: 09/745,427

(22) Filed: Dec. 26, 2000

(30) Foreign Application Priority Data

Dec. 23, 1999  (KR) .................................................. 99-60931

(51) Int. Cl.[7] ....................................................... G11C 7/00
(52) U.S. Cl. ........................................ 365/222; 365/189.05
(58) Field of Search ............................... 365/222, 189.05, 365/194, 233

(56) References Cited

U.S. PATENT DOCUMENTS 6,195,303 * 2/2001 Zheng .................................. 365/222

* cited by examiner

Primary Examiner—Vu A. Le
(74) Attorney, Agent, or Firm—Pillsbury Winthrop LLP

(57) ABSTRACT

A self refresh controlling apparatus for use in a semiconductor memory device includes a delay unit for delaying the clock buffer enable control signal by a predetermined time and an internal clock signal activation controller for controlling activation of the internal clock signal by logically combining the internal clock signal with a control signal generated under control of the delayed clock buffer enable control signal from the delaying unit and the internal clock signal in order to prevent mis-operation due to the internal clock signal generated late in completion of self refresh operation.

6 Claims, 5 Drawing Sheets

SELF-REFRESH CONTROLLING APPARATUS

BACKGROUND

1. Field of the Invention

The claimed inventions relate, at least generally, to a self-refresh controlling apparatus. More specifically, some of the claimed inventions feature a self refresh controlling apparatus capable of stabilizing circuit operation.

2. General Background and Related Art

Generally, self-refresh denotes a refresh operation performed internally with a predetermined period to maintain data stored in a memory cell during a waiting state in a semiconductor memory as a DRAM (Dynamic Random Access Memory).

A problem occurs due to the difficulty of adjusting the timing between the signal synchronized with the external clock signal and the signal not synchronized with the external clock signal. Furthermore, when a variety of frequencies should be adjusted, proper delays are required and the problem becomes more serious.

FIG. 1 (Prior Art) is a block diagram of a conventional self-refresh controlling apparatus. The apparatus includes a clock enable signal buffer 10 for buffering an externally provided clock enable signal cke and generating a self-refresh exit control signal s_ref_exit. A self-refresh logic 20 controls activation of a clock buffer enable control signal buf-en by performing the self-refresh operation depending on the state of the self-refresh exit control signal s_ref_exit from the clock enable signal buffer 10. A clock buffer 30 receives the clock buffer enable control signal buf-en for comparing the potential of an external input clock signal ext_clk with a reference to generate an internal clock signal int_clk. A command and address latch 40 latches a command and an address buffered with the internal clock signal int_clk in synchronization with the external clock signal ext_clk.

FIG. 2 (Prior Art) is a timing diagram explaining the operation of the self refresh controlling apparatus shown in FIG. 1 (Prior Art). The clock buffer enable control signal buf_en generated under control of the clock enable signal cke as shown in (d) is a signal generated that is not synchronized with the external clock signal ext_clk.

Therefore, when the external clock signal ext_clk is logic high during activation of the clock buffer 30, the internal clock signal int_clk is generated latter as shown in (c).

The self refresh controlling apparatus latches the output signal of a command and address buffer (not shown) in synchronization with the external clock signal ext_clk at the command and address latch 40 by using the internal clock signal int_clk. The output signal of the command and address buffer is adjusted so that it is applied from an external source as its set-up time and hold time match.

Subsequently, when the internal clock signal int_clk is activated latter as described above, the set-up time and the hold time of the output signal from the command and address buffer does not match, which leads error in operation that adversely affects circuit stability.

SUMMARY

The claimed inventions feature, at least in part, a self refresh controlling apparatus capable of stabilizing circuit operation. This stabilization is achieved by preventing failure after self refresh by matching the set-up time and the hold time of the clock buffer output signal by adjusting timing between the signal synchronized with the external clock signal and the signal not synchronized with the external clock signal. Accordingly, the self-refresh controlling apparatus of the present invention is useful for use with any semiconductor memory apparatus performing self-refresh.

An exemplary embodiment of the claimed inventions provides a self refresh controlling apparatus including a first buffering unit for buffering a clock enable signal received from an external source to generate a self refresh completion control signal. A self refresh logic controls activation of a clock buffer enable control signal by performing self refresh operation depending on the state of the self refresh completion control signal from the first buffering unit. A second buffering unit receives the clock buffer enable control signal for comparing a potential of an external clock signal with a reference potential to generate an internal clock signal. A delay unit delays the clock buffer enable control signal by a predetermined time. An internal clock signal activation controlling unit controls activation of the internal clock signal by logically combining the internal clock signal with a control signal generated under control of the delayed clock buffer enable control signal from the delaying unit and the internal clock signal. A latching unit latches, in synchronization with the external clock signal, a command and an address buffered by the internal clock signal of which timing is adjusted at the internal clock signal activation controlling unit.

BRIEF DESCRIPTION OF THE DRAWINGS

Exemplary embodiments of the claimed inventions will be explained in detail with reference to the accompanying drawings, in which:

DETAILED DESCRIPTION

Hereinafter, preferred embodiments of the present invention will be described in detail with reference to the accompanying drawings.

Figure 1:
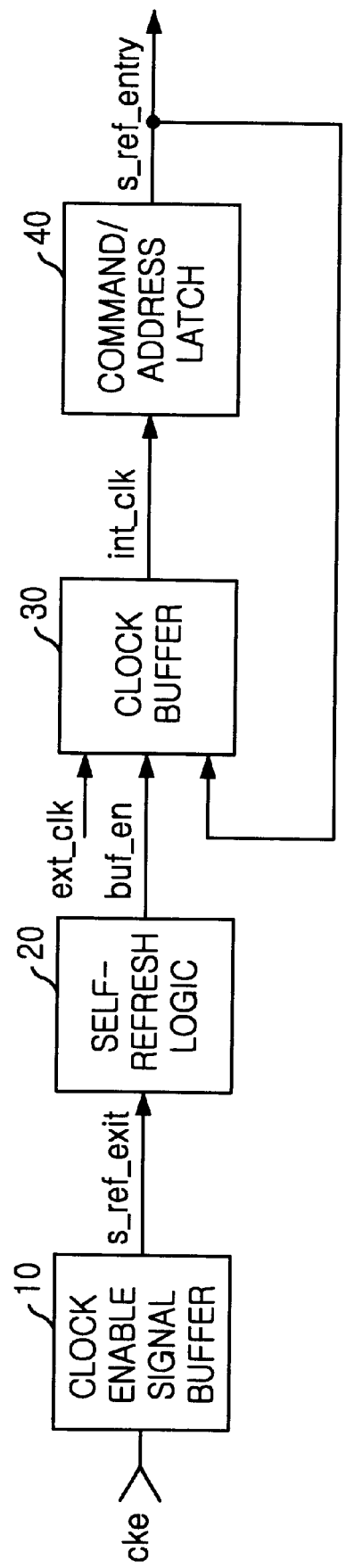
FIG. 1 (Prior Art) is a block diagram of a conventional self refresh controlling apparatus.
Figure 2:
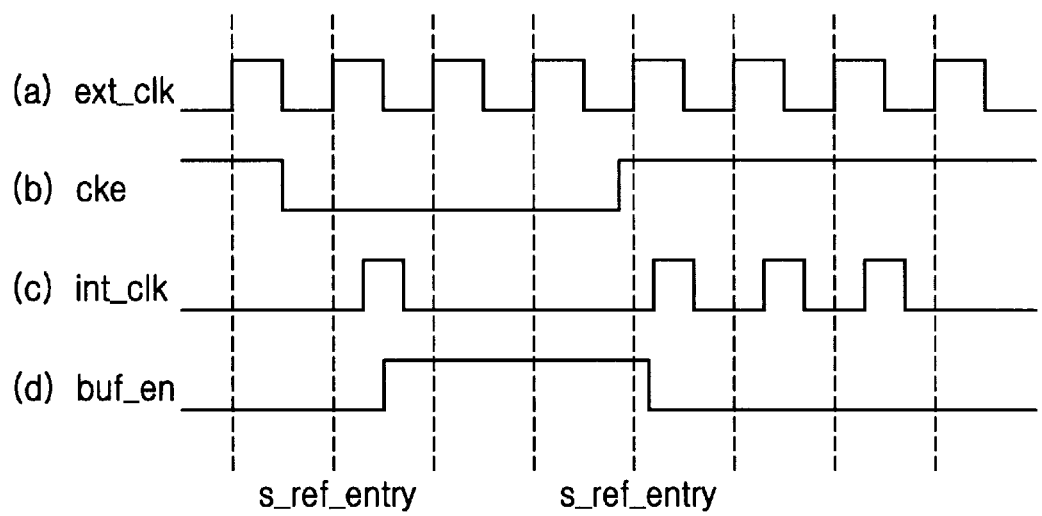
FIG. 2 (Prior Art) is an operational timing diagram of the conventional self refresh controlling apparatus in FIG. 1.
Figure 3:
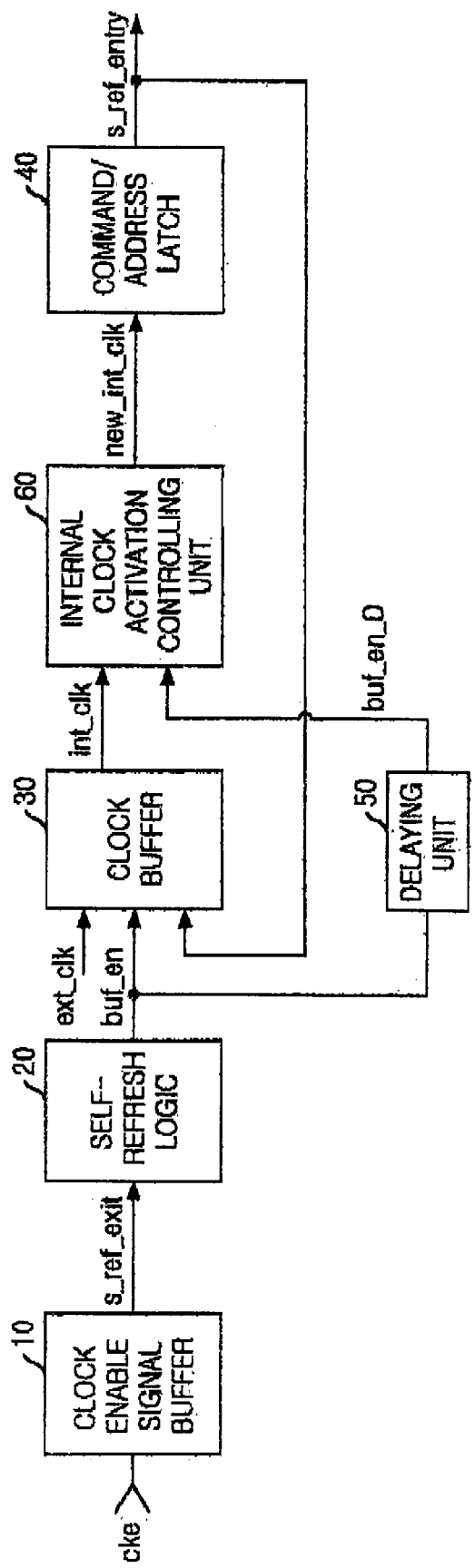
FIG. 3 is a block diagram of a self refresh controlling apparatus in accordance with the present invention.

FIG. 3 is a block diagram of an exemplary embodiment of a self refresh controlling apparatus constructed and arranged in accordance with the principles of the claimed inventions. A clock enable signal buffer 10 buffers a clock enable signal cke from an external source and generates a self-refresh exit control signal s_ref_exit. Self-refresh logic 20 controls activation of a clock buffer enable control signal buf-en by performing self-refresh operation depending on the state of the self-refresh exit control signal s_ref_exit from the clock enable signal buffer 10. A clock buffer 30 receives the clock buffer enable control signal buf-en for comparing the potential of an external input clock signal ext_clk with a reference potential to generate an internal clock signal int_clk. A delaying unit delays the clock buffer enable control signal buf_en by a predetermined time delay Dt. An internal clock signal activation controlling unit 60 controls activation of a new internal clock signal new_int_clk by logically combining the internal clock signal int_clk with a control signal ctrl generated under control of the clock enable control signal buf_en_D from the delaying unit 50 and the internal clock signal int_clk. A command and address latch 40 latches, in synchronization with the external clock signal ext_clk, a command and an address buffered with the internal clock signal int_clk of which activation timing is adjusted at the internal clock signal activation controlling unit 60.

Clock buffer 30 generates the internal clock signal int_clk. Delaying unit 50 delays the clock buffer enable controlling signal buf_en from the self refresh logic 20 by the time delay Dt. Internal clock signal activation controlling unit 60 provides the control signal for the command and address latch by adjusting the activation timing of the internal clock signal int_clk delay at the delaying unit 50. The following description focuses on elements 50 and 60.

Figure 4:
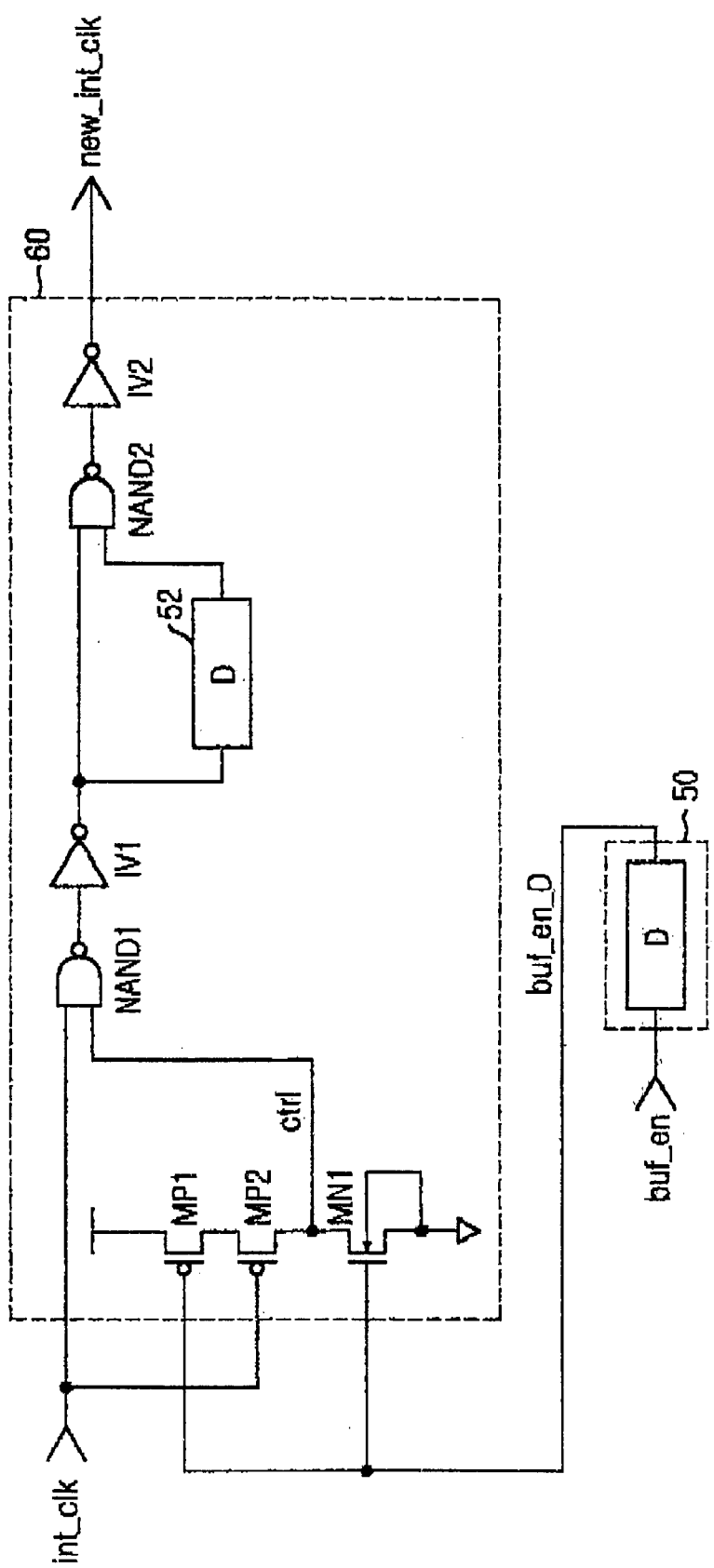
FIG. 4 is an embodiment of a delaying unit and an internal clock signal activation controlling unit (shown as a general block in FIG. 3)

FIG. 4 is a schematic diagram of an embodiment of a delaying unit and an internal clock signal activation controlling unit 60 (shown in FIG. 3). The delaying unit 50 can be simply constructed utilizing an inverter chain structure forming minimum delay Dt required to activate the clock buffer enable control signal buf_en later than the internal clock signal int_clk.

Internal clock signal activation controlling unit 60 includes a first and a second PMOS transistors MP1, MP2 serially coupled between the power voltage input and the control signal ctrl output. The gate of transistor MP2 is coupled to receive int_clk. The gate of transistor MP1 is coupled to receive the clock buffer enable control signal buf_en_D from the delaying unit 50. An NMOS transistor MN1 is coupled between the control signal ctrl output and the ground. The gate of MN1 is coupled to the clock buffer enable control signal buf_en_D from the delaying unit 50. A first logic unit including NAND1 and IV1, serially coupled, AND-operate the internal clock signal int_elk and the control signal ctrl. A delaying unit 52 inverts and delays the output signal of the first logic unit NAND1 and IV1, serially coupled. A second logic unit including NAND2 and IV2, serially coupled, AND-operate the output of the first logic unit NAND1 and IV1, serially coupled, and the output signal of the delaying unit 52.

Because of the configuration of delaying unit 50 and the internal clock signal activation control unit 60d as described above, the clock buffer enable control signal buf_en_D notifying completion of self refresh mode changes to a logic high only after the delay time Dt resulted from delaying unit 50 even if the internal clock signal int_clk generated at the clock buffer 30 is activated to logic high. Therefore, activation of the internal clock signal int_clk that is generated latter after self refresh completion that would otherwise case a misoperation is prevented.

Figure 5:
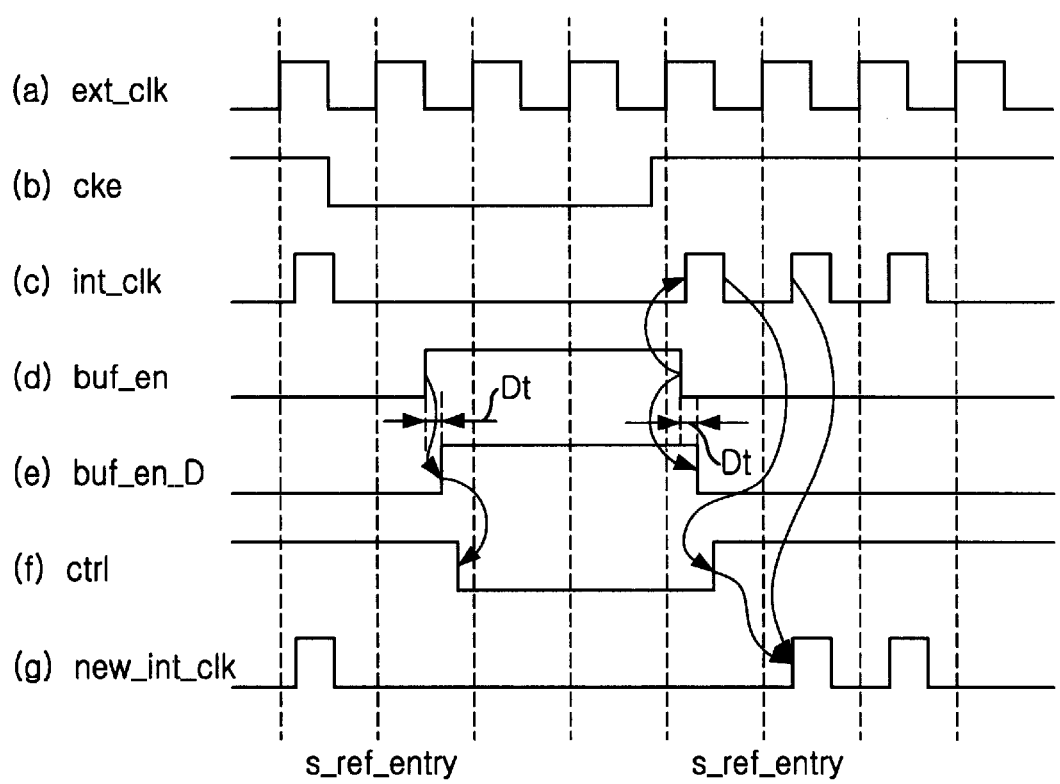
FIG. 5 is a timing diagram explaining the operation of a self refresh controlling apparatus in accordance with the present invention.

FIG. 5 is a timing diagram explaining the operation of a self refresh controlling apparatus in accordance with the present invention. As shown in (b) of FIG. 5, when the clock enable signal cke becomes low, the self refresh completion control signal s_ref_exit is deactivated and the clock buffer enable control signal buf_en notifying start of the self refresh mode changes to logic high as shown in (d).

Accordingly, if the internal clock signal int_clk is not generated as shown in (c) and the self refresh operation is started. At this time, because the clock buffer enable control signal buf_en is not synchronized with the external clock signal ext_clk, the internal clock signal int_clk is generated late as shown in (c) when the external clock signal ext_clk becomes high when the clock buffer 30 is again activated after completion of the self refresh operation. In order to repress the internal clock signal int_clk that is generated late and could lead to a mis-operation, the clock buffer enable control signal buf_en is delayed by the predetermined delay time Dt which is the minimum time duration required to repress activation of the internal clock signal generated late as shown in (e) to transfer as the control signal of the internal clock signal activation controlling unit 60.

Then, because the clock buffer enable control signal buf_en changes to a logic low only after the delay time Dt even when the internal clock signal int_clk generated at the internal clock buffer 30 is activated to logic high, the internal clock signal activation controlling unit 60 configured as shown in FIG. 4 causes the output signal of the first logic unit NAND1 and IN1, serially coupled, to be low, keeping the control signal ctrl low before the delay time Dt.

Accordingly, even though the internal clock signal int_clk is generated as logic high in completion of the self refresh operation, the internal clock signal int_clk is not generated at the internal clock signal activation controlling unit 60 before the delay time undergone at the delaying unit 50 so that a late-generated internal clock signal that could lead to a mis-operation can be repressed.

In the self refresh controlling apparatus of the present invention, the internal clock signal is repressed by activation control so that mismatching of the set-up time and the hold time of the command and address buffer output signal due to the internal clock signal generated late in completion of the self refresh operation and a mis-operation can be prevented. While the present invention has been shown and described with respect to the particular embodiments, it will be apparent to those skilled in the art that many changes and modifications may be made without departing from the spirit and scope of the invention as defined in the appended claims.

What is claimed is:

1. A self refresh controlling apparatus comprising;
   a first buffering means for buffering a clock enable signal received from an external source to generate a self refresh completion control signal;
   a self refresh logic means for controlling activation of a clock buffer enable control signal by performing a self refresh operation depending on the state of the self refresh completion control signal from the first buffering means;
   a second buffering means receiving the clock buffer enable control signal for comparing a potential of an external clock signal with a reference potential to generate an internal clock signal;
   a delaying means for delaying the clock buffer enable control signal by a predetermined time;
   an internal clock signal activation controlling means for controlling activation of the internal clock signal by logically combining the internal clock signal with a control signal generated under control of the delayed clock buffer enable control signal from the delaying means and the internal clock signal; and
   a latching means for latching, in synchronization with the external clock signal, a command and an address buffered by the internal clock signal of which timing is adjusted at the internal clock signal activation controlling means.

2. An apparatus according to claim 1, wherein the delaying means comprises an inverter chain for forming a delay time required to activate the clock buffer enable control signal latter than the internal clock signal generated at the second buffering means.

3. An apparatus according to claim 1, wherein the internal clock signal activation controlling means includes:
- a first and a second PMOS transistors serially coupled to each other between a power voltage input and the control signal output, having gates respectively coupled to the clock buffer enable control signal transferred through the delaying means and the internal clock signal;
- an NMOS transistor coupled between the control signal output and a ground and having a gate coupled to the clock buffer enable control signal transferred through the delaying means;
- a first logic means for AND-operating the internal clock signal and the control signal;
- a delaying means for inverting and delaying the output signal of the first logic means; and
- a second logic means for AND-operating the output signal of the first logic means and the output signal of the delaying means.

4. A self refresh controlling apparatus comprising;
- a first buffer constructed and arranged to buffer a clock enable signal received from an external source to generate a self refresh completion control signal;
- self refresh logic constructed and arranged to control activation of a clock buffer enable control signal by performing a self refresh operation depending on the state of the self refresh completion control signal from the first buffer;
- a second buffer constructed and arranged to receive the clock buffer enable control signal for comparing a potential of an external clock signal with a reference potential to generate an internal clock signal;
- a delay circuit constructed and arranged to delay the clock buffer enable control signal by a predetermined time;
- an internal clock signal activation controller constructed and arranged to controlling activation of the internal clock signal by logically combining the internal clock signal with a control signal generated under control of the delayed clock buffer enable control signal from the delay circuit and the internal clock signal; and
- a latch constructed and arranged to latch, in synchronization with the external clock signal, a command and an address buffered by the internal clock signal of which timing is adjusted at the internal clock signal activation controller.

5. An apparatus according to claim 4, wherein the delay circuit comprises an inverter chain for foiling a delay time required to activate the clock buffer enable control signal latter than the internal clock signal generated at the second buffer.

6. An apparatus according to claim 4, wherein the internal clock signal activation controller includes:
- a first and a second PMOS transistors serially coupled to each other between a power voltage input and the control signal output, having gates respectively coupled to the clock buffer enable control signal transferred through the delay circuit and the internal clock signal;
- an NMOS transistor coupled between the control signal output and a ground and having a gate coupled to the clock buffer enable control signal transferred through the delay circuit;
- a first logic circuit for AND-operating the internal clock signal and the control signal;
- a delay circuit constructed and arranged to invert and delay the output signal of the first logic circuit; and
- a second logic circuit constructed and arranged to AND-operating the output signal of the first logic circuit and the output signal of the delay circuit.

* * * * *